US006926390B2

(12) United States Patent
Fartash

(10) Patent No.: US 6,926,390 B2
(45) Date of Patent: Aug. 9, 2005

(54) METHOD OF FORMING MIXED-PHASE COMPRESSIVE TANTALUM THIN FILMS USING NITROGEN RESIDUAL GAS, THIN FILMS AND FLUID EJECTION DEVICES INCLUDING SAME

(75) Inventor: Arjang Fartash, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/359,912

(22) Filed: Feb. 5, 2003

(65) Prior Publication Data

US 2004/0150696 A1 Aug. 5, 2004

(51) Int. Cl.⁷ ................................................ B41J 2/05
(52) U.S. Cl. ........................................................ 347/64
(58) Field of Search ......................... 106/286.1, 286.8; 428/660; 347/64

(56) References Cited

U.S. PATENT DOCUMENTS

| | | |
|---|---|---|
| 3,878,079 A | 4/1975 | Schauer |
| 4,719,477 A | 1/1988 | Hess |
| 5,221,449 A | 6/1993 | Colgan et al. |
| 5,317,346 A | 5/1994 | Garcia |
| 6,139,699 A | 10/2000 | Chiang et al. |
| 6,162,589 A | 12/2000 | Chen et al. |
| 6,395,148 B1 * | 5/2002 | Whitman ............... 204/192.15 |
| 6,451,181 B1 | 9/2002 | Denning et al. |
| 6,458,255 B2 | 10/2002 | Chiang et al. |
| 6,488,823 B1 | 12/2002 | Chiang et al. |
| 2002/0070375 A1 | 6/2002 | Chiang et al. |

FOREIGN PATENT DOCUMENTS

| | | | |
|---|---|---|---|
| KR | 2002053997 | * | 7/2002 |
| WO | WO 01/64443 | | 7/2001 |
| WO | WO 01/64443 | | 9/2001 |
| WO | WO 03/072846 | | 9/2003 |

OTHER PUBLICATIONS

Hilke Donohue, et al. "Low –resistivity PVD a–tantalum: Phase formation and integration in ultra–low K dielectric/copper damascene structures".

D. Fischer, et al; "Barrier and Contact Behavior of Tantalum Base Thin Films for Use in Copper Metallization Scheme".

Yukio Limura et al., "Low–Stress Tantalum Absorbers Deposited by Sputtering for X–ray Masks", Journal of Vacuum Science & Technology B, American Institute of Physics, New York, US, vol. 7, No. 6, Nov. 1, 1989, pp. 1680–1683.

Baumann J et al., "Phase, Structure and Properties of Sputtered Ta and TaN/sub x/Films", 2001, Warrendale, PA, USA, Mater. Res. Soc, USA, Oct. 8, 2001, pp. 613–618.

International Search Report having International Application No. PCT/US2004/003150 mailed Aug. 13, 2004.

* cited by examiner

Primary Examiner—Michael S. Brooke

(57) ABSTRACT

The invention includes a method of forming mixed-phase compressive tantalum thin films using nitrogen residual gas. The method of the present invention may include selecting a pressure of nitrogen residual gas during plasma sputtering corresponding to a predefined ratio of beta- to alpha-tantalum. The method may be performed at substrate temperatures less than 300° C. Mixed-phase compressive tantalum thin films and fluid ejection devices are also disclosed.

23 Claims, 4 Drawing Sheets

METHOD OF FORMING MIXED-PHASE COMPRESSIVE TANTALUM THIN FILMS USING NITROGEN RESIDUAL GAS, THIN FILMS AND FLUID EJECTION DEVICES INCLUDING SAME

BACKGROUND OF THE INVENTION

Tantalum (Ta) thin films are widely used in manufacturing of semiconductor and micro-electromechanical (MEM) devices. For example, in semiconductor integrated circuit manufacturing, tantalum may be used as a diffusion barrier between copper and silicon. Tantalum may also be used as a gate electrode in metal oxide semiconductor field effect transistor (MOSFET) devices. Tantalum may also be used to absorb X-rays in X-ray masks. In thermal inkjet MEM devices such as a printhead, tantalum is used as a protective overcoat on the resistor and other substrate layers to protect the underlying layers from damage caused by cavitation from the collapsing ink bubbles.

Beta-tantalum is typically used in the manufacture of thermal inkjet devices, because it has not been possible to stabilize the alpha-tantalum phase in the compressive state of stress. The tantalum layer is traditionally composed of the metastable tetragonal phase of tantalum, known as the beta-phase or "beta-tantalum." Beta tantalum initiates during growth because of: 1) the presence of gas impurities present in the growth chamber, and 2) the underlying material type on the substrate. This conventional, default beta-tantalum layer is brittle and becomes unstable as temperatures increase. Above 300° C., beta-tantalum converts to the body-centered-cubic (bcc) alpha-phase or "alpha-tantalum." The thermo-mechanical conditions imposed during the firing of the ink, drive the default metastable beta-tantalum to convert to alpha-tantalum. Alpha-tantalum is the bulk equilibrium or the stable-phase of tantalum. It is essential to form compressive films on thermal inkjet printheads and other fluid ejection devices because films under tensile stress would peel off the substrate, blister or delaminate, thus limiting the useful life of the printhead.

For these and other reasons, there exists a need in the art for the present invention.

SUMMARY OF THE INVENTION

A method of forming mixed-phase compressive tantalum thin films is disclosed. The method may include forming a compressive mixed-phase tantalum thin film having a predefined ratio of beta- to alpha-tantalum by selecting a pressure of nitrogen residual gas during plasma sputtering corresponding to the predefined ratio of the beta- to alpha-tantalum.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

The following drawings illustrate exemplary embodiments for carrying out the invention. Like reference numerals refer to like parts in different views or embodiments of the drawings.

DETAILED DESCRIPTION

Figure 1:
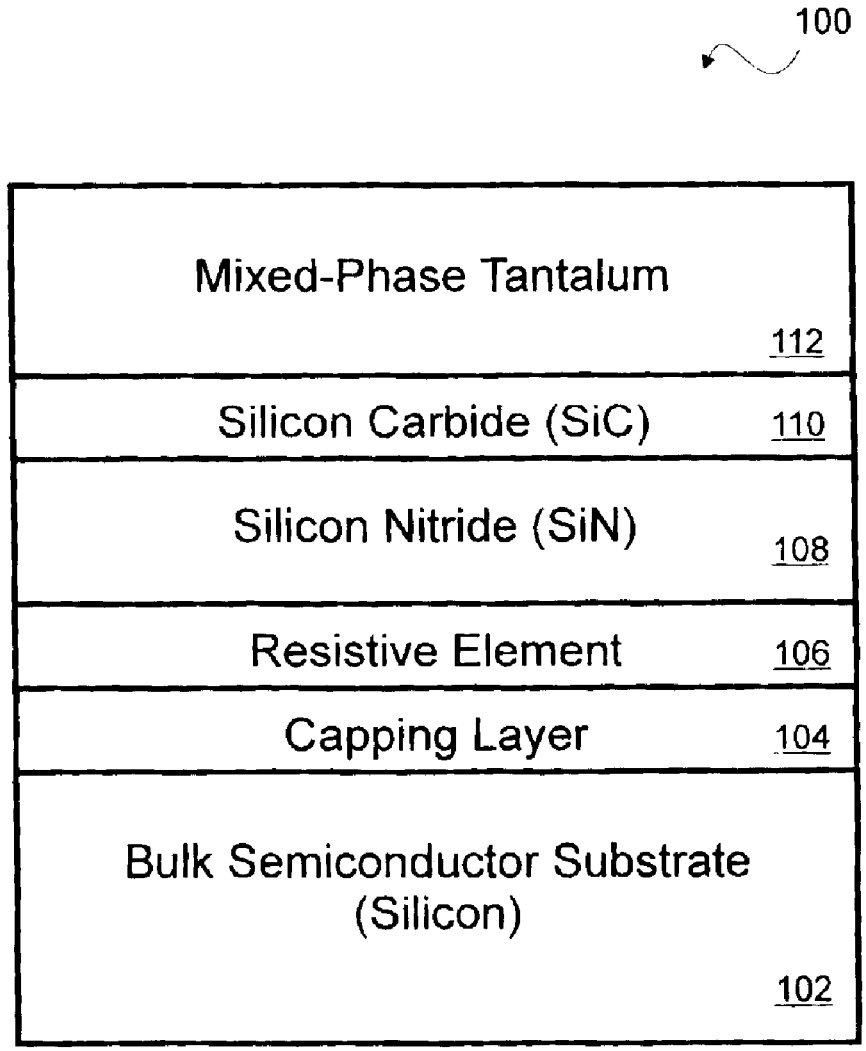
FIG. 1 is a cross-sectional graphical representation of a fluid ejection device including a mixed-phase tantalum thin film according to an embodiment of the present invention.

The invention includes methods of forming mixed-phase compressive tantalum thin films using nitrogen residual gas. Mixed-phase compressive tantalum thin films and thermal inkjet printheads are also disclosed. Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

A thermal inkjet (TIJ) printhead typically contains a silicon substrate including conductive and resistive layers to provide electrical features that are used to heat and eject ink from the printhead. The resistive layers are used to heat ink until it vaporizes, creating a bubble. The expansion of the ink vapor forms a bubble that ejects the ink out from the printhead as an ink drop onto a target, typically paper, as a single dot or pixel. The term "firing" as used herein contemplates the whole process of heating of the ink and ejecting the ink as an ink drop and the collapse of the ink vapor bubble. The terms "thermal inkjet printhead", "printhead substrate" and "printhead" may be used synonymously herein.

Problems associated with conventional TIJ printheads include failures resulting from high thermo-mechanical stresses caused during and after the firing of the ink drop, mechanical shock generated by the collapse of the ink bubble (cavitation) and the corrosive nature of the ink. For these reasons, protective layers are typically placed over the resistor and other layers forming the printhead to prolong the life of the printhead. The terms "resistor," "resistive element" and "resistive layers" may be used synonymously herein.

Resistive elements on a printhead substrate are typically covered with protective layers of silicon nitride (SiN), silicon carbide (SiC) and tantalum. Silicon nitride is ceramic material and an electrical insulator that protects the resistor from electrically shorting. Silicon carbide is a hard semiconductor material and structurally amorphous. Silicon carbide is used to prevent ink from permeating through and reaching the underlying layers of a printhead and provides mechanical robustness. Tantalum has good mechanical strength to withstand the thermo-mechanical stresses that result from the ejection of the ink. Additionally, tantalum has chemical inertness at elevated temperatures that minimizes corrosion caused by ink.

FIG. 1 is a cross-sectional graphical representation of a fluid ejection device 100 including a mixed-phase tantalum thin film. The fluid ejection device 100 may include a bulk substrate 102, a capping layer 104, a resistive element 106, a silicon nitride layer 108, silicon carbide layer 110 and a mixed-phase tantalum layer 112. The bulk substrate 102 may be formed of silicon or any other suitable semiconducting or nonconducting material. Capping layer 104 may be formed of a variety of different materials, for example and not by way of limitation, tetraethylorthosilicate (TEOS), field oxide, silicon dioxide, aluminum oxide, silicon carbide and silicon nitride. TEOS is a form of silicon oxide, commonly used in the semiconductor integrated circuit (IC) industry. The capping layer 104 may also be replaced with a multi-layer structure composed of a stack of the above-listed exemplary, different, capping materials.

Various layers of conductive materials (not shown for clarity) and resistive materials, e.g., resistive element 106, may be formed upon the surface of the bulk substrate 102, or the capping layer 104, to implement the functional aspects of a TIJ printhead as known to one of ordinary skill in the art. The resistive element 106 may be formed of refractory materials, such as a tantalum-aluminum (TaAl) alloy or any other suitable refractory, resistive material. The mixed-phase tantalum layer 112 may have a thickness ranging from about 100 Angstroms (Å) to about 10,000 Å.

Passivation coatings, including silicon nitride layer 108 and silicon carbide layer 110, may be placed over the resistive element 106. Silicon nitride 108 is a ceramic material and an electrical insulator. The silicon nitride layer 108 may be used to protect the resistive element 106 from electrically shorting. The thickness of the silicon nitride layer 108 may range from about 100 Å to about 10,000 Å. Silicon carbide 110 is a ceramic material. The silicon carbide layer 110 may be used to prevent ink from permeating through and reaching the underlying conductive elements (not shown) and/or resistive elements 106 of a TIJ printhead. Furthermore, a silicon carbide layer 110 provides mechanical robustness to the TIJ printhead. The thickness of the silicon carbide layer 110 may range from about 100 Å to about 10,000 Å. Fluid ejection device 100 may include other layers (not shown) such as thermally grown oxide or silicon dioxide ($SiO_2$).

Examples of thermal inkjet printhead geometries and manufacturing processes suitable for use with the present invention are disclosed in commonly assigned U.S. Pat. Nos. 4,719,477, 5,317,346 and 6,162,589 and pending patent applications titled "Plurality of Barrier Layers", and "Firing Chamber Geometry for Inkjet Printhead", all of which are incorporated herein by reference for all purposes.

Figure 2:
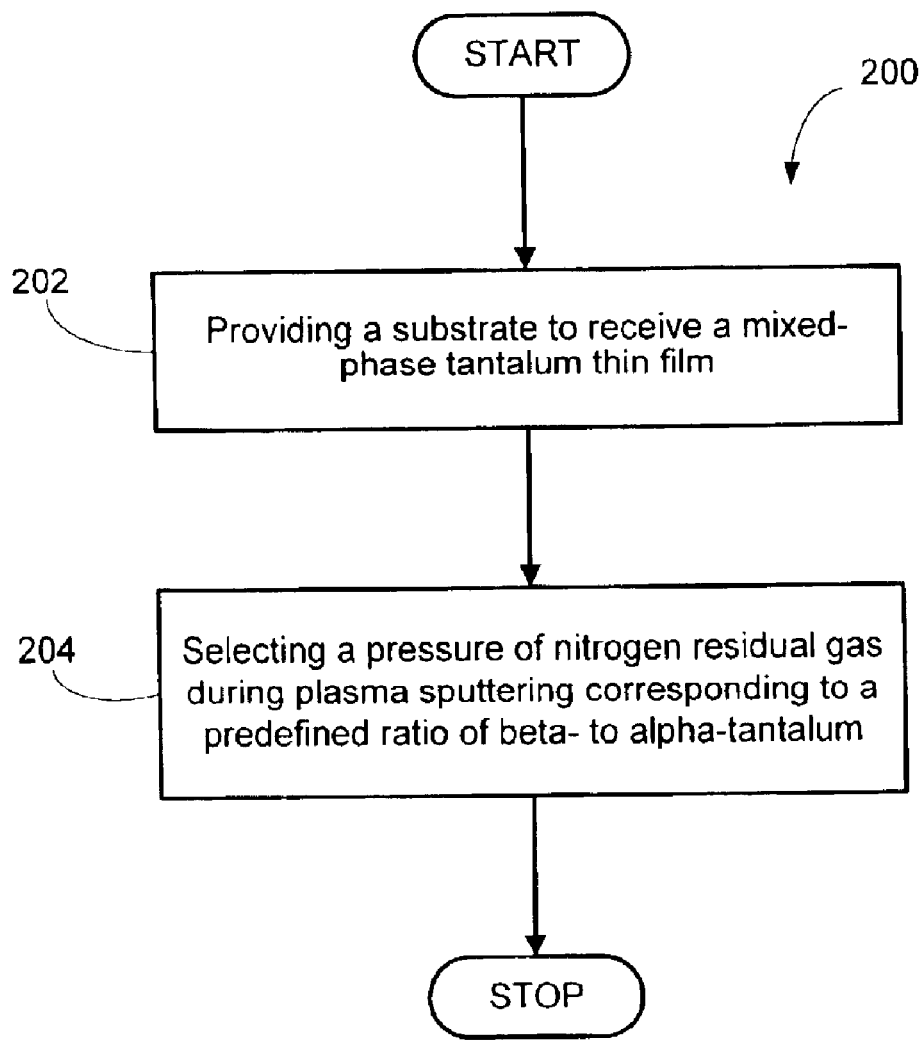
FIGS. 2 and 3 are flow charts of a method of forming mixed-phase tantalum thin films according to an embodiment of the present invention.

FIG. 2 is a flow chart of a method 200 of forming mixed-phase tantalum thin films according to the present invention. Method 200 may include providing 202 a substrate to receive a mixed-phase tantalum thin film. Method 200 may further include selecting 204 a pressure of nitrogen residual gas during plasma sputtering corresponding to a predefined ratio of the beta- to alpha-tantalum. The predefined ratio of the beta- to alpha-tantalum may range from about 0.001 to about 1,000, consistent with the present invention. Given the highly oriented growth structures on the substrates, the predefined ratio of beta- to alpha-tantalum may be measured by the equation:

$$\frac{I(\beta Ta_{002})}{I(\alpha Ta_{110})}$$

where $I(\beta Ta_{002})$ and $I(\alpha Ta_{110})$ comprise integrated intensities of reflections in an X-ray diffraction micrograph for beta- and alpha-tantalum, respectively. The nitrogen residual gas pressure may be varied from about $10^{-8}$ mTorr up to about 30 mTorr. The term "nitrogen residual gas pressure" as used herein refers to very small partial pressures of nitrogen.

The nitrogen residual gas may be introduced or intermixed with the flow of an inert sputtering gas, e.g., helium, neon, argon, krypton, xenon and radon. Argon is perhaps the most common of inert gases used in sputter deposition processes. The use of inert gases in plasma sputtering is within the knowledge of one of ordinary skill in the art and, thus, will not be further elaborated on herein. The intermixing of a small flow of nitrogen gas as described herein may be controlled through a separate mass flow controller device that enables the operator to adjust the residual pressure of nitrogen at increments as small as approximately $10^{-8}$ Torr.

Some methods of forming alpha-tantalum thin films may require heating of the substrate during sputtering to at least 300° C. By controlling the substrate temperature, flow rate, plasma composition and plasma energy, the immediate atomic surface temperature may be influenced. The term "substrate temperature" as used herein refers to a bulk substrate with or without additional thin films applied, e.g., passivation layers like silicon nitride and/or silicon carbide. Elevating the temperature of the substrate during sputtering is not required according to method 200 of the present invention. For example, mixed-phase compressive tantalum thin films may be formed during sputtering at substrate temperatures below 300° C. in accordance with the present invention.

Figure 3:
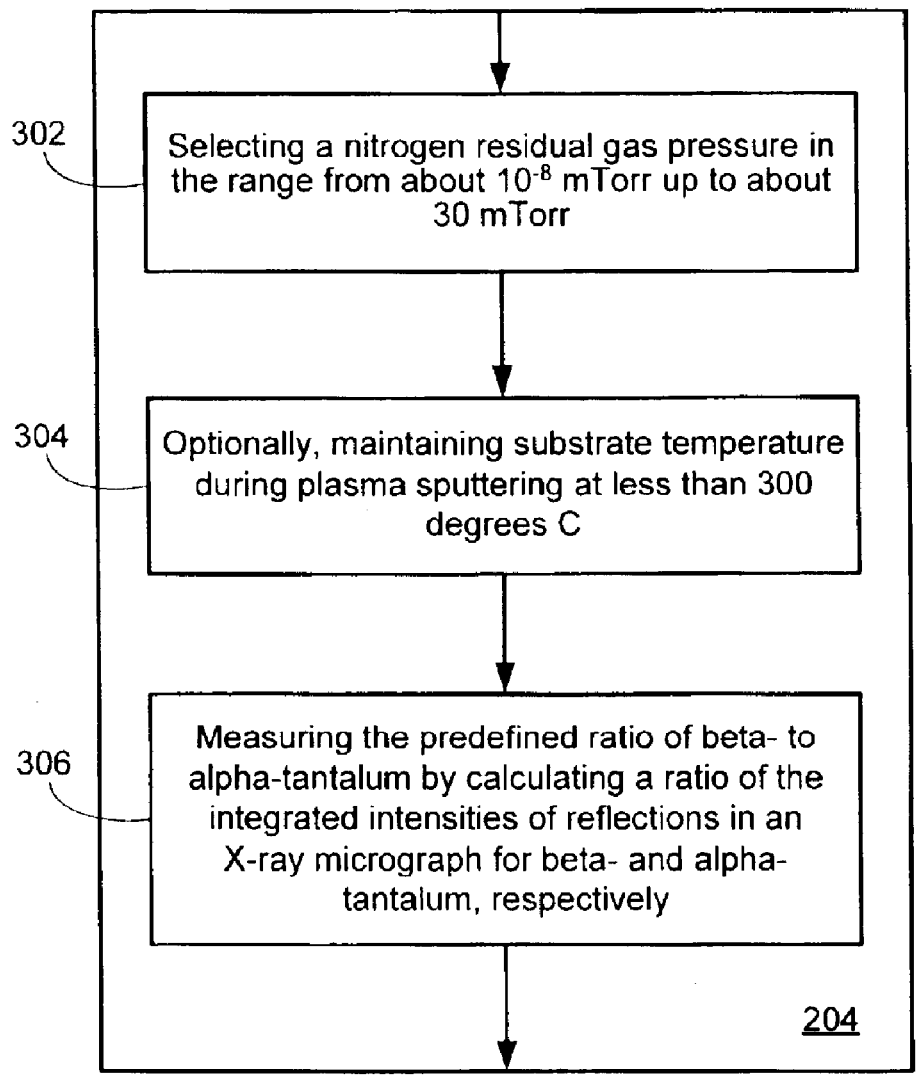

Referring to FIG. 3, selecting 204 a pressure of nitrogen residual gas during plasma sputtering may further include selecting 302 a nitrogen residual gas pressure in the range from about $10^{-8}$ mTorr up to about 30 mTorr. Selecting 204 a pressure of nitrogen residual gas may optionally include maintaining 304 the substrate temperature at less than 300° C. during plasma sputtering and measuring 306 the predefined ratio of beta- to alpha-tantalum by calculating a ratio of the integrated intensities of reflections in an X-ray micrograph for beta- and alpha-tantalum, respectively, as described above.

Furthermore, some methods of forming tantalum thin films do not provide compressive tantalum films. As discussed above, it is essential to form compressive tantalum films to ensure that the tantalum films adhere to, or do not peel off of, the wafer. Examples of forming compressive mixed-phase tantalum thin films in accordance with aspects of the present invention are described below with reference to FIGS. 2 and 3 and Tables 1 and 2.

A series of studies on the growth of tantalum films were conducted to form tantalum films with compressive stress composed of predefined ratios of alpha- and beta-phases of tantalum. The studies also showed that controlled ratios of these phases are obtained by adjusting the pressure of nitrogen residual gas in the plasma during the sputter deposition process. For each wafer in the study, tantalum was deposited to a thickness of approximately 3,000 Å on double passivation coated silicon wafer substrates. The double passivation coating included a layer of silicon nitride of approximately 2,400 Å in thickness and a layer of silicon carbide to a thickness of approximately 1,200 Å. Prior to depositing tantalum, the wafer bow of each of the substrates was measured to determine the film stress. The tantalum was sputter deposited according to the parameters shown in Table 1, below.

TABLE 1

| Wafer No. | $N_2$ Pressure (mTorr) | Stress (MPa) | $N_2$ Flow Rate (SCCM) | Argon (Ar) Pressure (mTorr) | Ar Flow Rate (SCCM) | Plasma Power (kW) |
|---|---|---|---|---|---|---|
| 1 | <10$^{-6}$ | −1193.0 | 0.00 | 10 | 100 | 10 |
| 2 | 0.005 | −1163.8 | 0.70 | 10 | 100 | 10 |
| 3 | 0.01 | −1150.4 | 1.10 | 10 | 100 | 10 |
| 4 | 0.02 | −1154.4 | 1.60 | 10 | 100 | 10 |
| 5 | 0.03 | −1203.8 | 2.00 | 10 | 100 | 10 |
| 6 | 0.04 | −1198.5 | 2.50 | 10 | 100 | 10 |
| 7 | 0.05 | −1207.5 | 3.00 | 10 | 100 | 10 |
| 8 | 0.06 | −1207.8 | 3.40 | 10 | 100 | 10 |
| 9 | 0.07 | −1223.7 | 3.80 | 10 | 100 | 10 |
| 10 | 0.08 | −1254.7 | 4.20 | 10 | 100 | 10 |
| 11 | 0.09 | −1270.8 | 4.70 | 10 | 100 | 10 |
| 12 | 0.10 | −1170.6 | 5.20 | 10 | 100 | 10 |
| 13 | 0.11 | −1457.8 | 5.70 | 10 | 100 | 10 |

Additionally, a thin layer of gold, approximately 2,000 Å thick, was subsequently sputter deposited on the tantalum to ensure that successive substrates would not be contaminated by particles sputtered off from the edges of the stainless steel substrate holders during the pre-sputter cleaning of the substrates. The gold layer was wet etched to remove the gold completely and the wafer bow was measured to determine the tantalum layer stress.

Table 1 shows tantalum film stress at various ratios of beta- to alpha-tantalum as a function of nitrogen flow rate. At a given partial pressure of nitrogen gas the tantalum film stress may be varied by imposing a voltage bias of −1 to −300 V on the substrate. Generally, increased negative voltage bias results in increased compressive stress. As shown in column 2 of Table 1, the partial pressure of nitrogen was varied between <10$^{-6}$ mTorr for wafer no. 1 to 0.11 mTorr for wafer no. 13. Column 3 shows data corresponding to the measured stress (in MPa) for each wafer. Columns 4–6 provide additional processing parameters including: nitrogen flow rate (in SCCM, i.e., flow of Standard gas at a pressure of one atmosphere at a rate of one Cubic Centimeter per Minute), argon pressure (in mTorr), argon flow rate (in SCCM), and plasma power (in kW).

Table 2, below, shows X-ray diffraction measurements for the same 13 wafers shown in Table 1. Column 2 shows beta-tantalum lattice spacing along the [002] direction as measured in Å. Column 3 shows alpha-tantalum lattice spacing along the [110] direction as measured in Å. Column 4 shows the ratio of beta- to alpha-tantalum concentrations as calculated from the integrated intensities of X-ray diffraction reflections. Column 5 shows the beta-tantalum grain size as measured in Å. Column 6 shows the beta-tantalum rocking curve as measured in angular degrees. The width of the rocking curve provides a measure of the orientational distribution of beta-tantalum columnar grains in angular degrees. The beta-tantalum rocking curve is measured at Full Width of the peak at Half Maximum peak height (FWHM).

The ratio of beta- to alpha-tantalum may be measured using other techniques known to one of ordinary skill in the art, such as resistivity measurements. A resistivity measurement relies on the fact that the resistivity of beta-tantalum is about seven times larger than the resistivity of alpha-tantalum. However, impurities can significantly alter the resistivity data without affecting the phase structure of the tantalum. Thus, the X-ray diffraction technique described herein is a more accurate measure of the ratio of beta- to alpha-tantalum.

TABLE 2

| Wafer No. | Beta-Tantalum Lattice Spacing $d_{[002]}$ (Å) | Alpha-Tantalum Lattice Spacing $d_{[110]}$ (Å) | Ratio of Beta- to Alpha-Tantalum Reflection Intensities $I(\beta Ta_{002})/I(\alpha Ta_{110})$ | Beta-Tantalum Grain Size (Å) | Beta-Tantalum Rocking Curve (Degrees FWHM) |
|---|---|---|---|---|---|
| 1 | 2.680 ± 0.002 | 3.330 ± 0.001 | 151.0 | 530 | 9.8 |
| 2 | 2.681 ± 0.002 | 3.341 ± 0.001 | 25.2 | 530 | 10.0 |
| 3 | 2.681 ± 0.002 | 3.341 ± 0.001 | 24.3 | 530 | 9.8 |
| 4 | 2.682 ± 0.002 | 3.340 ± 0.001 | 17.5 | 530 | 10.3 |
| 5 | 2.683 ± 0.002 | 3.348 ± 0.001 | 13.4 | 510 | 11.3 |
| 6 | 2.685 ± 0.002 | 3.352 ± 0.001 | 11.3 | 510 | 11.0 |
| 7 | 2.685 ± 0.002 | 3.354 ± 0.001 | 7.1 | 510 | 11.2 |
| 8 | 2.686 ± 0.002 | 3.354 ± 0.001 | 6.0 | 470 | 11.6 |
| 9 | 2.689 ± 0.002 | 3.361 ± 0.001 | 3.1 | 470 | 12.0 |
| 10 | 2.690 ± 0.002 | 3.364 ± 0.001 | 2.7 | 510 | 12.3 |
| 11 | 2.690 ± 0.002 | 3.366 ± 0.001 | 2.0 | 470 | 11.9 |
| 12 | 2.690 ± 0.002 | 3.364 ± 0.001 | 1.8 | 470 | 12.6 |
| 13 | 2.692 ± 0.002 | 3.370 ± 0.001 | 1.1 | 490 | 13.4 |

As shown in Table 2, the ratio of beta- to alpha-tantalum for the studies ranged from about 1.1 to about 151. However, ratios of beta- to alpha-tantalum may be formed ranging from about 0.001 to about 1,000 according to the method 200 of the present invention.

Figure 4:
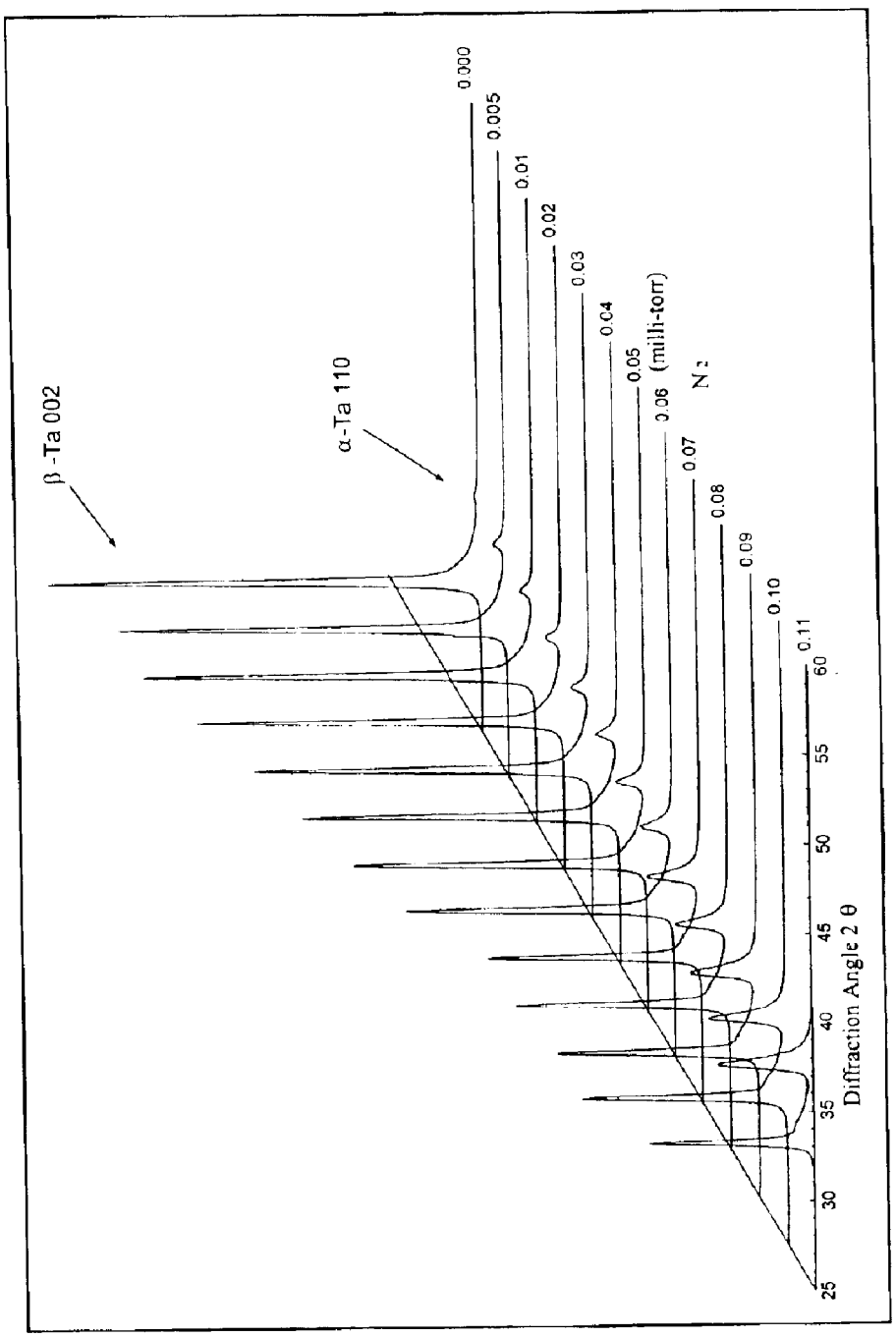
FIG. 4 is a graph illustrating X-ray diffraction measurements on exemplary wafers having mixed-phase ratios beta- and alpha-tantalum according to an embodiment of the present invention.

FIG. 4 is a graph illustrating X-ray diffraction measurements on exemplary wafers having mixed-phase ratios beta- and alpha-tantalum corresponding to the data in Tables 1 and 2 in accordance with the present invention. As shown by the peaks in the reflection intensities, beta-tantalum evolves to alpha-tantalum with increasing partial pressures of residual nitrogen gas during sputtering deposition of tantalum on silicon carbide substrates. FIG. 4 shows X-ray diffraction scans for a series of 3,000 Å thick tantalum films grown on each of the study wafers. Nitrogen partial pressure for each of the study wafers is shown to the right of each of the micrographs. The arrows in FIG. 4 point to peak reflections from the (002) plane and (110) plane of beta- and alpha-phase tantalum, respectively. While the residual pressure of nitrogen is shown ranging up to about 0.11 mTorr, the invention is not so limited. The nitrogen residual gas pressure may be varied from about 10$^{-8}$ mTorr up to about 30 mTorr in accordance with the present invention. Ratios of beta- to alpha-tantalum may range from about 0.001 to about 1,000 in accordance with the present invention.

The mixed-phase compressive tantalum thin films of the present invention may be applied to any suitable substrate. For convenience of discussion, a thermal inkjet printhead was described as an exemplary embodiment. However, the mixed-phase compressive tantalum thin films of the present invention are not limited to the exemplary embodiments disclosed herein. It is to be understood that the above-referenced arrangements are illustrative of the applications for the principles of the present invention. Numerous modifications and alternative arrangements may be devised without departing from the spirit and scope of the present invention. While the present invention has been shown in the drawings and described above in connection with the exemplary embodiments of the invention, it will be apparent to those of ordinary skill in the art that numerous modifications may be implemented without departing from the principles and concepts of the invention as set forth in the claims.

What is claimed is:

1. A mixed-phase compressive tantalum thin film having a predefined ratio of beta- to alpha-tantalum formed by selecting at least one pressure of nitrogen residual gas during plasma sputtering corresponding to the predefined ratio of the beta- to alpha-tantalum,
   wherein a compressive stress of the mixed-phase compressive tantalum thin film is between about 1150 MPa to about 1450 MPa.

2. The mixed-phase compressive tantalum thin film according to claim 1, further formed at substrate temperatures less than 300° C.

3. The mixed-phase compressive tantalum thin film according to claim 1, wherein the predefined ratio of beta- to alpha-tantalum falls between about 0.001 to about 1,000.

4. The mixed-phase compressive tantalum thin film according to claim 1, wherein the predefined ratio of beta- to alpha-tantalum is measured by the equation:

$$\frac{I(\beta Ta_{002})}{I(\alpha Ta_{110})}$$

where $I(\beta Ta_{002})$ and $I(\alpha Ta_{110})$ comprise integrated intensities of reflections in an X-ray diffraction micrograph for beta- and alpha-tantalum, respectively.

5. A fluid ejection device comprising an insulating ceramic material;
   a second ceramic material in contact with the insulating ceramic material; and
   a compressive tantalum layer deposited on the second ceramic material, the compressive tantalum layer comprising a predefined ratio of beta- to alpha-tantalum,
   wherein a compressive stress of the compressive tantalum layer is between about 1150 MPa to about 1450 MPa.

6. The fluid ejection device according to claim 5, wherein the insulating ceramic material comprises silicon nitride (SiN).

7. The fluid ejection device according to claim 6, wherein the silicon nitride comprises a layer having a thickness of about 100 Å to about 10,000 Å.

8. The fluid ejection device according to claim 5, wherein the second ceramic material comprises silicon carbide (SiC).

9. The fluid ejection device according to claim 8, wherein the silicon carbide comprises a layer having a thickness of about 100 Å to about 8,000 Å.

10. The fluid ejection device according to claim 5, wherein the compressive tantalum layer comprises a thickness from about 100 Å to about 10,000 Å.

11. The fluid ejection device according to claim 5, wherein the predefined ratio of beta- to alpha-tantalum falls between about 0.001 to about 1,000.

12. The fluid ejection device according to claim 5, wherein the predefined ratio of beta- to alpha-tantalum is measured by the equation:

$$\frac{I(\beta Ta_{002})}{I(\alpha Ta_{110})}$$

where $I(\beta Ta_{002})$ and $I(\alpha Ta_{110})$ comprise integrated intensities of reflections in an X-ray diffraction micrograph for beta- and alpha-tantalum, respectively.

13. The fluid ejection device according to claim 5, wherein the fluid ejection device comprises a thermal inkjet printhead.

14. The fluid ejection device according to claim 5, wherein the fluid ejection device comprises an inkjet cartridge.

15. The fluid ejection device according to claim 5, wherein the fluid ejection device comprises a thermal inkjet printer.

16. The fluid ejection device according to claim 5, wherein a substrate including the insulating ceramic material and the second ceramic material is maintained at less than 300° C. during sputtering.

17. A fluid ejection device comprising: a resistive element;
   a first passivation layer formed over the resistive element;
   a second passivation layer formed over the first passivation layer; and
   a protective layer formed over the second passivation layer, the protective layer including beta-tantalum and alpha-tantalum.
   wherein the protective layer is formed to have a compressive stress of about 1150 MPa to about 1450 MPa.

18. The fluid ejection device according to claim 17, wherein the first passivation layer comprises silicon nitride (SiN).

19. The fluid ejection device according to claim 17, wherein the first passivation layer has a thickness of about 100 Å to about 10,000 Å.

20. The fluid ejection device according to claim 17, wherein the second passivation layer comprises silicon carbide (SiC).

21. The fluid ejection device according to claim 17, wherein the second passivation layer has a thickness of about 100 Å to about 8,000 Å.

22. The fluid ejection device according to claim 17, wherein the protective layer has a thickness of about 100 Å to about 10,000 Å.

23. The fluid ejection device according to claim 17, wherein a ratio of beta-tantalum to alpha-tantalum in the protective layer is between about 0.001 to about 1,000.

* * * * *

UNITED STATES PATENT AND TRADEMARK OFFICE
CERTIFICATE OF CORRECTION

PATENT NO. : 6,926,390 B2 Page 1 of 1
APPLICATION NO. : 10/359912
DATED : August 9, 2005
INVENTOR(S) : Arjang Fartash It is certified that error appears in the above-identified patent and that said Letters Patent is hereby corrected as shown below:

In column 7, line 44, in Claim 5, delete "comprising" and insert -- comprising: --, therefor.

In column 8, line 41, in Claim 17, delete "alpha-tantalum." and insert -- alpha-tantalum, --, therefor.

Signed and Sealed this

Twenty-first Day of July, 2009

JOHN DOLL
*Acting Director of the United States Patent and Trademark Office*